United States Patent
Yasuda et al.

(10) Patent No.: US 9,376,758 B2
(45) Date of Patent: Jun. 28, 2016

(54) ELECTROPLATING METHOD

(75) Inventors: Shingo Yasuda, Tokyo (JP); Fumio Kuriyama, Tokyo (JP); Masashi Shimoyama, Tokyo (JP); Mizuki Nagai, Tokyo (JP); Yusuke Tamari, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 819 days.

(21) Appl. No.: 13/311,020

(22) Filed: Dec. 5, 2011

(65) Prior Publication Data

US 2012/0152749 A1  Jun. 21, 2012

(30) Foreign Application Priority Data

Dec. 21, 2010  (JP) ................................. 2010-284326

(51) Int. Cl.
 *C25D 5/18* (2006.01)
 *C25D 7/12* (2006.01)

(52) U.S. Cl.
 CPC . *C25D 5/18* (2013.01); *C25D 7/123* (2013.01)

(58) Field of Classification Search
 CPC ....... C25D 5/18; C25D 7/123; H01L 21/2885
 USPC ....................................................... 205/104
 See application file for complete search history.

(56) References Cited

U.S. PATENT DOCUMENTS

| | | | | |
|---|---|---|---|---|
| 3,943,048 A | * | 3/1976 | Fisher et al. | 204/293 |
| 4,666,567 A | * | 5/1987 | Loch | 205/83 |
| 5,268,235 A | * | 12/1993 | Lashmore et al. | 428/610 |
| 5,750,017 A | * | 5/1998 | Zhang | 205/102 |
| 5,972,192 A | * | 10/1999 | Dubin et al. | 205/101 |
| 6,746,591 B2 | | 6/2004 | Zheng et al. | |
| 6,806,186 B2 | | 10/2004 | Chen et al. | |
| 7,022,211 B2 | | 4/2006 | Yoshioka et al. | |
| 7,402,227 B2 | | 7/2008 | Yoshioka et al. | |
| 2003/0019755 A1 | * | 1/2003 | Hey et al. | 205/87 |
| 2005/0006244 A1 | * | 1/2005 | Uzoh et al. | 205/148 |
| 2007/0202686 A1 | * | 8/2007 | Dixit et al. | 438/625 |

FOREIGN PATENT DOCUMENTS

| | | |
|---|---|---|
| EP | 1132500 A2 * | 9/2001 |
| JP | 62-42420 | 2/1987 |
| JP | 11-97391 | 4/1999 |
| JP | 2000-87292 | 3/2000 |
| JP | 2000-129490 | 5/2000 |
| JP | 2000-353675 | 12/2000 |
| JP | 2001-150454 | 6/2001 |
| JP | 2001-303289 | 10/2001 |

(Continued)

*Primary Examiner* — Bryan D. Ripa
(74) *Attorney, Agent, or Firm* — Wenderoth, Lind & Ponack, L.L.P.

(57) ABSTRACT

An electroplating method can securely and efficiently fill a plated metal into deep high-aspect ratio vias in a bottom-up manner without producing defects in the plated metal. The electroplating method includes: immersing a substrate, having vias formed in a surface, and an anode in a plating solution in a plating tank, the anode being disposed opposite the surface of the substrate; and intermittently passing a plating current at a constant current value between the substrate and the anode in such a manner that the supply and the stop of the plating current are repeated, and that the proportion of a current supply time during which the plating current is supplied increases with the progress of plating, thereby filling a plated metal into the vias.

8 Claims, 9 Drawing Sheets

(56) References Cited

FOREIGN PATENT DOCUMENTS

| | | |
|---|---|---|
| JP | 2002-121699 | 4/2002 |
| JP | 2003-253490 | 9/2003 |
| JP | 2003-318544 | 11/2003 |
| JP | 2004-124111 | 4/2004 |
| JP | 2005-97732 | 4/2005 |
| JP | 3641372 | 4/2005 |
| JP | 3780302 | 5/2006 |
| JP | 2006-518808 | 8/2006 |
| JP | 2006-519931 | 8/2006 |
| JP | 2006-265735 | 10/2006 |
| JP | 2007-297652 | 11/2007 |
| JP | 2008-506841 | 3/2008 |
| JP | 2010-10557 | 1/2010 |
| TW | I270583 | 1/2007 |
| WO | 2004/067806 | 8/2004 |
| WO | 2004/081262 | 9/2004 |
| WO | 2006/036252 | 4/2006 |

* cited by examiner

ELECTROPLATING METHOD

BACKGROUND OF THE INVENTION

1. Field of the Invention

The present invention relates to an electroplating method, and more particularly to an electroplating method which is useful for filling a metal, such as copper, into vias in the manufacturing of a substrate, such as a semiconductor substrate or the like, which has a number of through-vias vertically penetrating in its interior, and which can be used in so-called three-dimensional packaging of semiconductor chips.

2. Description of the Related Art

A technique of forming through-vias of a metal such as copper, vertically penetrating through a semiconductor substrate, is known as a method to electrically connect the layers of a multi-layer stack of semiconductor substrates. FIGS. 1A through 1C show an exemplary process for producing a substrate having therein through-vias of copper. First, as shown in FIG. 1A, a substrate W is prepared by forming a plurality of upwardly-opening vias 12 in a base 10, such as a silicon wafer, e.g., by using the lithography/etching technique, and thereafter forming, e.g., by PVD, a barrier layer 14 of a metal such as Ti (titanium) on an entire surface of the base 10, including interior surfaces of the vias 12, and then forming a copper seed layer 16 on a surface of the barrier layer 14. The diameter "d" of the vias 12 is, for example, 2 to 50 μm, in particular 10 to 20 μm, and the depth "h" of the vias 12 is, for example, 20 to 150 μm.

Besides Ti, other metals, such as Ta (tantalum) and W (tungsten), or a nitride thereof, can be used for the barrier layer 14.

Next, copper electroplating is carried out on the surface of the substrate W using the copper seed layer 16 as a cathode, thereby filling a plated metal (copper) 18 into the vias 12 and depositing the plated metal 18 on the surface of the copper seed layer 16, as shown in FIG. 1B.

Thereafter, as shown in FIG. 1C, the extra copper seed layer 16 and the extra plated metal 18 on the base 10 are removed, e.g., by chemical mechanical polishing (CMP). Further, the back surface side of the base 10 is polished away, e.g., to the position shown by the two-dot chain line in FIG. 10, thereby exposing the bottom face of the plated metal 18 embedded in the vias 12. The substrate W having therein through-vias of copper (plated metal 18), vertically penetrating through the substrate W, can be produced in this manner.

The aspect ratio, i.e., the depth-to-diameter ratio, of the vias 12 is generally large, such as 8 to 10. In addition, the vias 12 generally have a large size. In order to completely fill copper (plated metal) into such vias 12, having a large aspect ratio and a large size, by electroplating without producing defects such as voids in the embedded metal, it is usually necessary to perform the electroplating in a bottom-up manner of allowing the plated metal to grow preferentially from the bottoms of the vias 12. Such bottom-up plating is generally carried out by using a plating solution containing various additives such as SPS (bis(3-sulfopropyl)disulfide) as a plating accelerator, PEG (polyethylene glycol) as a suppressor, and PEI (polyethylene imine) as a leveler. These additives exert their effects after they are adsorbed onto a surface of a substrate.

Japanese Patent No. 3641372 proposes a plating method which comprises forming an initial plated film by passing a direct current between a seed layer and an anode at a current density of 4 to 20 A/dm$^2$ for 0.1 to 5 seconds, and then subsequently forming a secondary plated film by passing a direct current between the seed layer and the anode at a current density of 0.5 to 5 A/dm$^2$. Japanese Patent No. 3780302 proposes a plating method which comprises first carrying out electroplating at a cathode current density of 5 to 10 A/dm$^2$ for 10 seconds to 5 minutes, and then subsequently carrying out electroplating at a cathode current density of 0.5 to 3 A/dm$^2$ for 15 to 180 minutes. Japanese Patent Laid-Open Publication No. 2003-318544 proposes carrying out electroplating at stepwise increasing current densities. Further, Japanese Patent Laid-Open Publication No. 2005-97732 proposes applying a stepped voltage, which is varied stepwise, or a pulsed voltage between a substrate and an anode during electroplating of the substrate.

SUMMARY OF THE INVENTION

When filling a plated metal such as copper into vias, provided in a substrate, by electroplating, plating metal ions are likely to be deficient in the bottoms of the vias or in their vicinities as compared to the outside surface of the substrate. The plated film therefore tends to be thin in the bottoms of the vias. The metal ion concentration of a plating solution decreases in the vicinity of the surface of the substrate onto which the plated metal is depositing. The decrease in the metal ion concentration of the plating solution is larger in the vias. Especially when the vias are deep ones having a large aspect ratio, the metal ion concentration of the plating solution significantly decreases in the bottoms of the vias because of insufficient supply of metal ions by ion diffusion. The plated film therefore tends to be considerably thin in the bottoms of the vias. Further, in order to promote the bottom-up growth of the plated metal by the use of additives in the plating solution, as described above, it is necessary to supply a sufficient amount of metal ions into the vias.

When dissolution of a metal (metal ions) in a plating solution from a soluble anode takes place during electroplating, the current density at the anode is preferably kept in an appropriate range. This can prevent deterioration of an additive component(s) of the plating solution and can stably form a good-quality plated metal (plated film) on a surface of a substrate which serves as a cathode.

On the other hand, the current density at the anode needs to be kept at a low level in order to prevent the formation of voids in the plated metal to be embedded in vias. Thus, it is sometimes difficult to keep an appropriate current density at the anode.

The present invention has been made in view of the above situation. It is therefore an object of the present invention to provide an electroplating method which can securely and efficiently fill a plated metal, such as copper, into deep high-aspect ratio vias in a bottom-up manner without producing defects, such as voids, in the plated metal to be embedded.

In order to achieve the above object, the present invention provides an electroplating method comprising: immersing substrate, having vias formed in a surface, and an anode in a plating solution in a plating tank, the anode being disposed opposite the surface of the substrate; and intermittently passing a plating current at a constant current value between the substrate and the anode in such a manner that the supply and the stop of the plating current are repeated, and that the proportion of a current supply time during which the plating current is supplied increases with the progress of plating, thereby filling a plated metal into the vias.

According to this electroplating method, a plating current is intermittently supplied between a substrate and an anode while repeating the supply and the stop of the plating current. During a current stop time when the supply of the plating current is stopped, a decrease in the metal ion concentration of the plating solution in the vicinity of the substrate, especially a shortage of metal ions in the bottoms of vias, can be eliminated by utilizing diffusion of ions in the plating solution towards the substrate caused by a concentration gradient of the ions. This can promote the bottom-up growth of plating. Further, according to this electroplating method, the plating current at a constant current value is intermittently passed between the substrate and the anode in such a manner that the proportion of the current supply time during which the plating current is supplied increases with the progress of plating. This makes it possible to keep an anode current density in an appropriate range during the supply of the plating current while controlling an average current density at a low level to prevent the formation of voids in the plated metal to be embedded in the vias, thus enabling good via-filling plating.

In a preferred aspect of the present invention, a current stop time during which the supply of the plating current is stopped decreases with the progress of plating.

As a plated metal is gradually filled into vias with the progress of plating, the depth of the unfilled portion of each via gradually decreases, that is, the aspect ratio of the unfilled portion gradually decreases. Accordingly, filling of the plated metal into the vias can be performed efficiently by decreasing, with the progress of plating, a current stop time which is to supply metal ions, e.g., into the vias.

In a preferred aspect of the present invention, the current supply time is constant throughout the plating process.

In a preferred aspect of the present invention, the current supply time increases with the progress of plating.

Filling of a plated metal into vias can be performed efficiently also by increasing the current supply time with the progress of plating.

In a preferred aspect of the present invention, a current stop time during which the supply of the plating current is stopped is constant throughout the plating process.

In a preferred aspect of the present invention, a current supply pitch, which is the sum of the current supply time and a current stop time during which the supply of the plating current is stopped, is constant throughout the plating process.

In order to prevent dissolution of a plated film during a current stop time, a weak current may be passed between the substrate and the anode during the current stop time to keep the potential of the plated film lower than its natural potential.

The present invention makes it possible to securely and efficiently fill a plated metal, such as copper, into deep high-aspect ratio vias in a bottom-up manner without producing defects, such as voids, in the plated metal to be embedded.

DETAILED DESCRIPTION OF THE PREFERRED EMBODIMENTS

Figure 1A:
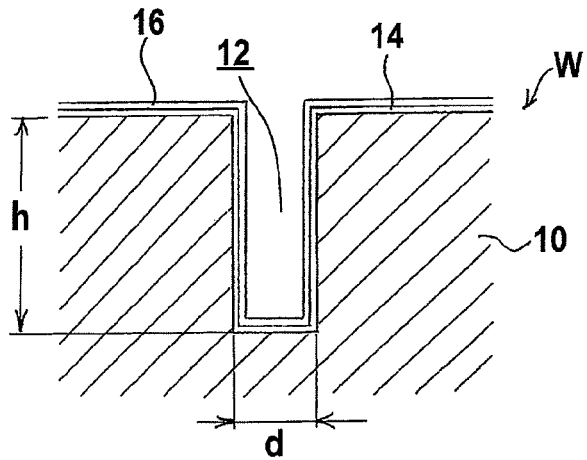
FIGS. 1A through 1C are diagrams illustrating, in a sequence of process steps, a process for producing a substrate having therein through-vias of copper that vertically penetrate through the substrate.
Figure 1B:
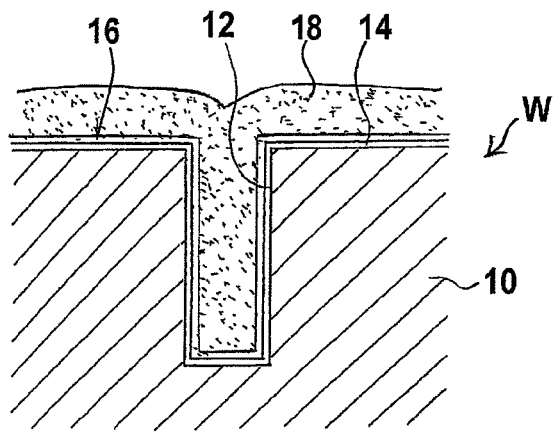
Figure 1C:
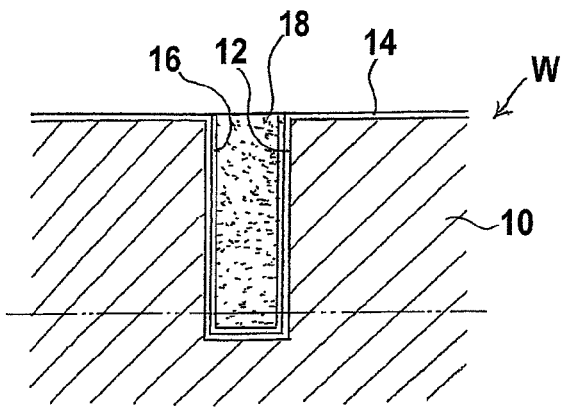

Preferred embodiments of the present invention will now be described with reference to the drawings. The following description illustrates an exemplary case where a substrate W, which has been produced by forming vias 12 in a surface of a base 10 such as a silicon wafer, forming a barrier layer 14 on an entire surface of the base 10, including surfaces of the vias 12, and then forming a copper seed layer 16 on the surface of the barrier layer 14, is prepared, as shown in FIG. 1A; and copper electroplating of the surface of the substrate W is carried out to fill the plated metal (copper) 18 into the vias 12, as shown in FIG. 1B.

Figure 2:
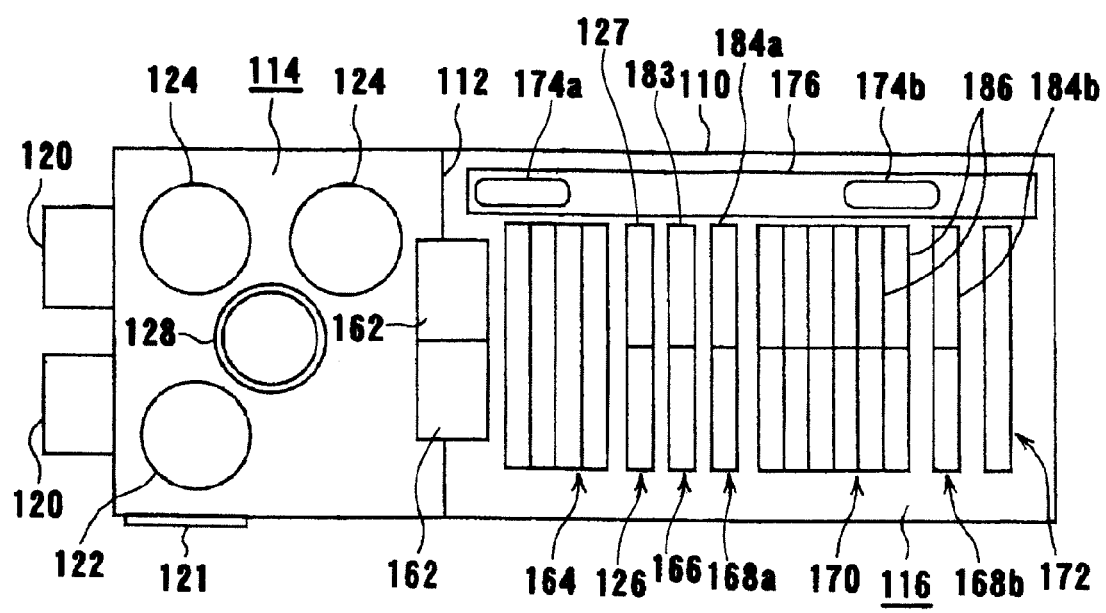
FIG. 2 is an overall layout plan view of a plating facility for carrying out an electroplating method of the present invention.

FIG. 2 is an overall layout plan view of a plating facility for carrying out an electroplating method of the present invention. This plating facility is designed so as to automatically perform all plating processes including pretreatment of a substrate, plating, and post-treatment of the plating, in a successive manner. The interior of an apparatus frame 110 having an armored panel attached thereto is divided by a partition plate 112 into a plating space 116 for performing a plating process of a substrate and treatments of the substrate to which a plating solution is attached, and a clean space 114 for performing other processes, i.e., processes not directly involving a plating solution. Two substrate holders 160 (see FIG. 3) are arranged in parallel, and substrate attachment/detachment stages 162 to attach a substrate to and detach a substrate from each substrate holder 160 are provided as a substrate delivery section on a partition portion partitioned by the partition plate 112, which divides the plating space 116 from the clean space 114. Loading/unloading ports 120, on which substrate cassettes storing substrates are mounted, are connected to the clean space 114. Further, the apparatus frame 110 has a console panel 121 provided thereon.

In the clean space 114, there are disposed an aligner 122 for aligning an orientation flat or a notch of a substrate with a predetermined direction, two cleaning/drying devices 124 for cleaning a plated substrate and rotating the substrate at a high speed to spin-dry the substrate. Further, a first transfer robot 128 is disposed substantially at the center of these processing devices, i.e. the aligner 122 and the cleaning/drying devices 124, to thereby transfer and deliver a substrate between the processing devices 122, 124, the substrate attachment/detachment stages 162, and the substrate cassettes mounted on the loading/unloading ports 120.

The aligner 122 and the cleaning/drying devices 124 disposed in the clean space 114 are designed so as to hold and process a substrate in a horizontal state in which a front face of the substrate faces upward. The first transfer robot 128 is designed so as to transfer and deliver a substrate in a horizontal state in which a front face of the substrate faces upward.

In the plating space 116, in the order from the partition plate 112, there are disposed a stocker 164 for storing or temporarily storing the substrate holders 160, a pretreatment device 126 for carrying out a pretreatment (pre-wetting treatment) for cleaning the surface of the substrate with a pretreatment liquid, such as pure water (DIW) or the like, and enhancing a hydrophilicity of the surface of the substrate by wetting with the pretreatment liquid, an activation treatment device 166 for etching, for example, an oxide film, having a high electrical resistance, on a seed layer formed on the surface of the substrate with an inorganic acid solution, such as sulfuric acid or hydrochloric acid, or an organic acid solution, such as citric acid or oxalic acid, to remove the oxide film, a first water-cleaning device 168a for cleaning the surface of the substrate with pure water, a plating apparatus 170 for carrying out plating, a second water-cleaning device 168b, and a blowing device 172 for dewatering the plated substrate. Two second transfer robots 174a and 174b are disposed beside these devices so as to be movable along a rail 176. One of the second transfer robots 174a transfers the substrate holders 160 between the substrate attachment/detachment stages 162 and the stocker 164. The other of the second transfer robots 174b transfers the substrate holders 160 between the stocker 164, the pretreatment device 126, the activation treatment device 166, the first water-cleaning device 168a, the plating apparatus 170, the second water-cleaning device 168b, and the blowing device 172.

Figure 3:
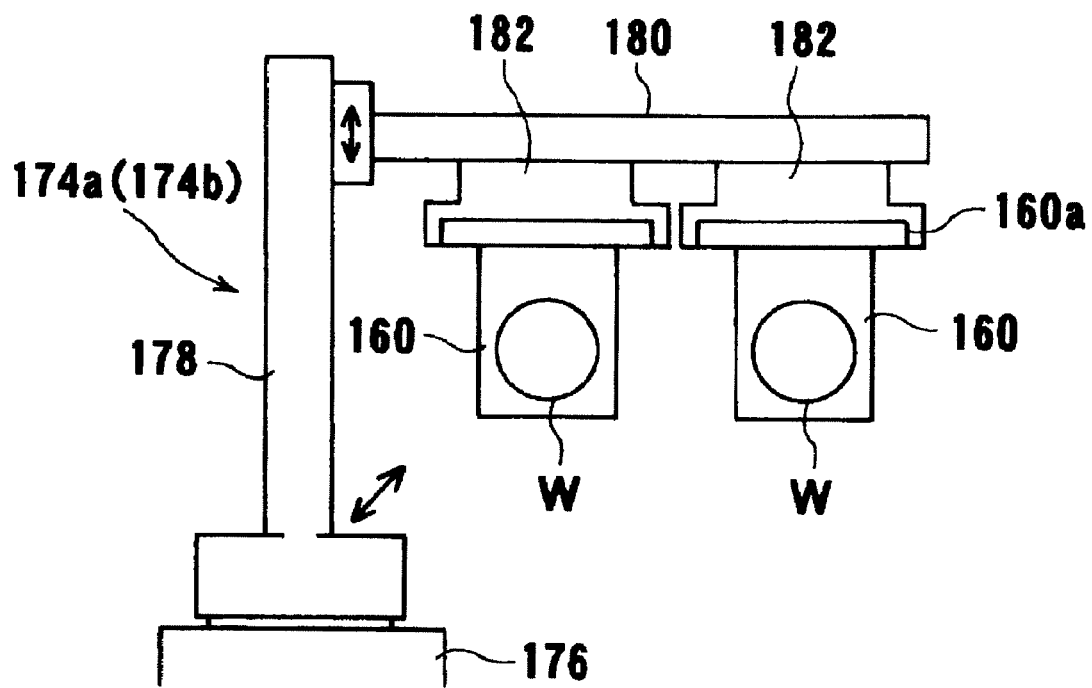
FIG. 3 is a schematic view of a transfer robot provided in the plating facility shown in FIG. 2.

As shown in FIG. 3, each of the second transfer robots 174a and 174b has a body 178 extending in a vertical direction and an arm 180 which is vertically movable along the body 178 and rotatable about its axis. The arm 180 has two substrate holder retaining portions 182 provided in parallel for detachably retaining the substrate holders 160. The substrate holder 160 is designed so as to hold a substrate W in a state in which a front face of the substrate is exposed while a peripheral portion of the substrate is sealed, and to be capable of attaching the substrate W to the substrate holder 160 and detaching the substrate W from the substrate holder 160.

Figure 4:
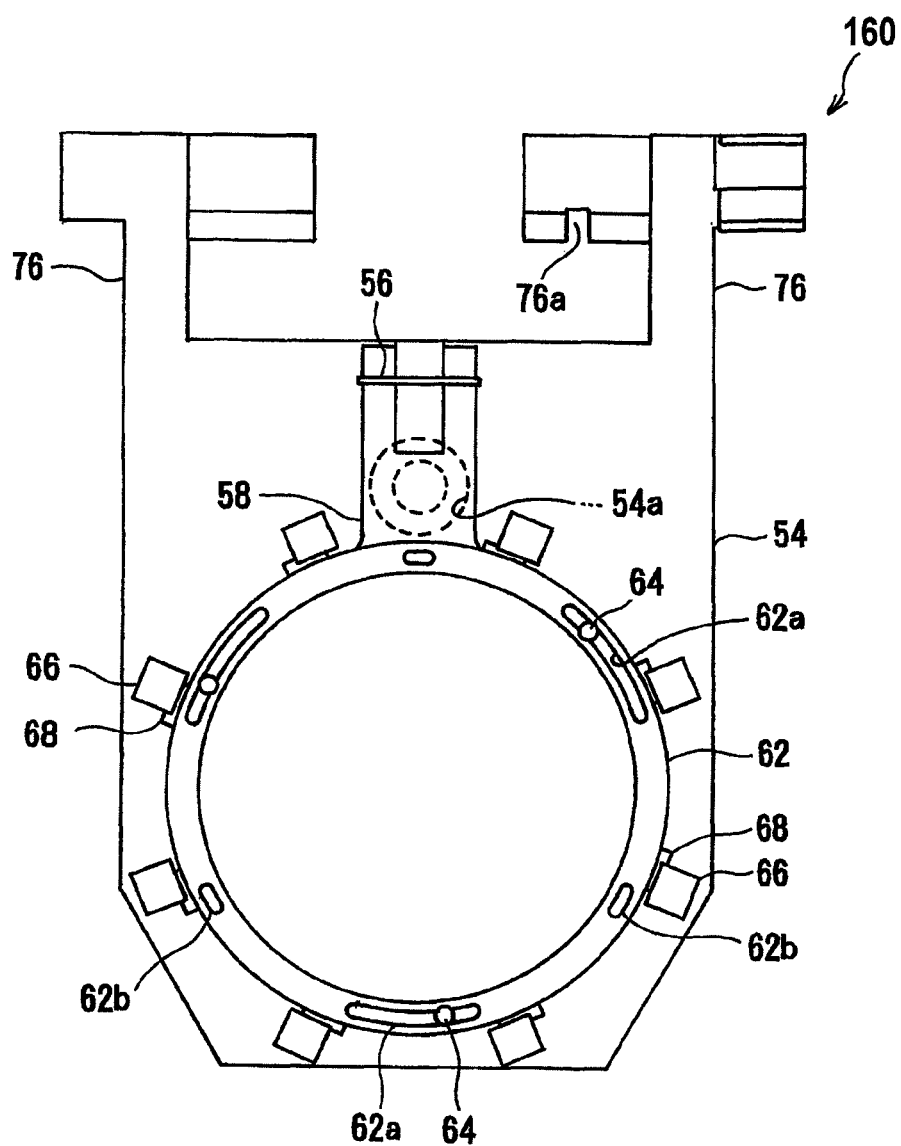
FIG. 4 is a front view of a substrate holder.
Figure 5:
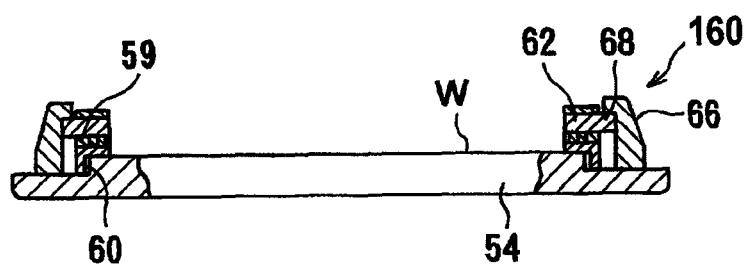
FIG. 5 is a cross-sectional view of the substrate holder shown in FIG. 4, illustrating a substrate held and sealed by the substrate holder.
Figure 6:
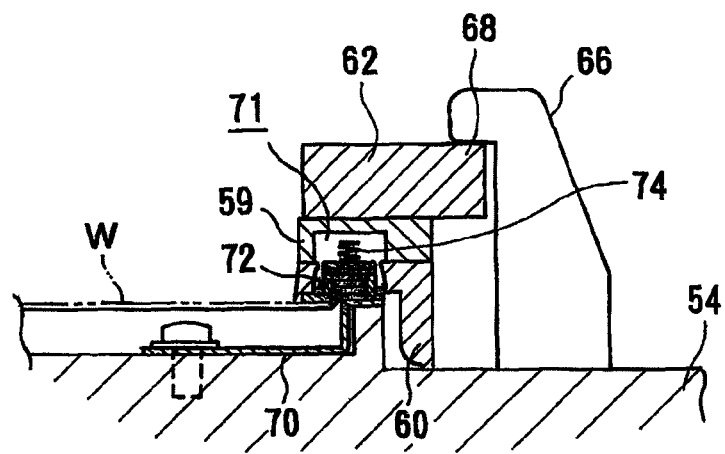
FIG. 6 is an enlarged cross-sectional view of a portion of the substrate holder shown in FIG. 4, illustrating feeding of electricity to the substrate held by the substrate holder.

As shown in FIGS. 4 through 6, the substrate holder 160 includes a flat, rectangular shaped fixed supporting member 54, and a ring-shaped moveable supporting member 58 mounted on the fixed supporting member 54 and capable of opening and closing over the fixed supporting member 54 through a hinge 56. A ring-like seal packing 60, having a rectangular cross-section with an open bottom with one of the parallel sides longer than the other, is mounted at the fixed supporting member 54 side of the moveable supporting member 58 through a packing base 59 made of, e.g., vinyl chloride, serving as a reinforcing member and having a good lubrication with a clamp ring 62. The clamp ring 62 is held on the fixed supporting member 54 via bolts 64 passing through a plurality of long holes 62a formed along the circumference of the clamp ring 62 so as to be rotatable and not be removed from the fixed supporting member 54.

Pawls 66 shaped roughly like a upside-down letter L are arranged at regular intervals around the periphery of the moveable supporting member 58 and mounted on the fixed supporting member 54. A plurality of protrusions 68 are integrally formed at intervals equivalent to those of the pawls 66 on the outer surface of the clamp ring 62. Slightly elongated holes 62b are formed in, e.g., three locations in the clamp ring 62, as shown in FIG. 4, for rotating the clamp ring 62. The top surface of each protrusion 68 and the bottom surface of each pawl 66 are tapered in the rotating direction in opposing directions from each other.

When the moveable supporting member 58 is in an open state, a substrate W is inserted and positioned correctly in the center of the fixed supporting member 54. The moveable supporting member 58 is closed through the hinge 56. Subsequently, the clamp ring 62 is rotated in the clockwise direction until the protrusions 68 slide under the pawls 66 shaped roughly like a upside-down letter L, thereby locking the moveable supporting member 58 to the fixed supporting member 54. By rotating the clamp ring 62 in the counterclockwise direction, the protrusions 68 slide out from under the pawls 66 shaped roughly like a upside-down letter L, thereby unlocking the moveable supporting member 58 from the fixed supporting member 54.

As shown in FIG. 6, when the moveable supporting member 58 is locked on the fixed supporting member 54, the short leg of the seal packing 60 on the inner side is in press contact with the surface of the substrate W, while the longer leg on the outer side is in press contact with the surface of the fixed supporting member 54, thereby forming a reliable seal.

As shown in FIG. 6, conductors (electrical contact points) 70 connected to an external electrode (not shown) are disposed on the fixed supporting member 54. The edges of the conductors 70 are exposed on the surface of the fixed supporting member 54 at outer side of the substrate W. Depressions 71 are formed inside the moveable supporting member 58 through the seal packing 60 at a position facing the exposed portion of the conductors 70. A metal armature 72 is accommodated in each of the depressions 71. Each of the metal armature 72 has a rectangular cross-section with an open bottom. A spring 74 presses each of the metal armatures 72 against the fixed supporting member 54.

With this construction, when the moveable supporting member 58 is in a locked position as described above, the pressing forces of the springs 74 provide electrical contacts between the exposed portions of the conductors 70 and the outer legs of the metal armatures 72, and also between the inner legs of the metal armatures 72 and the substrate W at the sealed position by the seal packing 60. In this way, electricity can be supplied to the substrate W while the substrate W is in a sealed state.

At least one of the contacting surface of the conductor 70 which contacts the metal armature 72, the contacting surface of the metal armature 72 which contacts the conductor 70, and the contacting surface of the metal armature 72 which contacts the substrate W is preferably coated with a metal such as gold or platinum by plating. Alternatively, the conductor 70 and the metal armature 72 may be made of stainless steal which has an excellent corrosion resistance.

The moveable supporting member 58 is opened and closed by a cylinder (not shown) and the weight of the moveable supporting member 58 itself. A through-hole 54a is formed in the fixed supporting member 54. The cylinder is provided at a position facing the through-hole 54a when the substrate holder 160 is mounted on one of the substrate attachment/detachment stages 162. With this construction, the moveable supporting member 58 is opened by extending a cylinder rod (not shown) to push the moveable supporting member 58 upward through the through-hole 54a. By retracting the cylinder rod, the moveable supporting member 58 closes by its own weight.

In this embodiment, the moveable supporting member 58 is locked and unlocked by rotating the clamp ring 62. A locking/unlocking mechanism is provided on the ceiling side. The locking/unlocking mechanism has pins disposed at positions corresponding to the holes 62b of the substrate holder 160 placed on one of the substrate attachment/detachment stages 162 positioned its center side. In this state, when the one of the substrate attachment/detachment stages 162 is raised, the pins enter the holes 62b. The clamp ring 62 is rotated by rotating the pins around the axial center of the clamp ring 62. Since only one locking/unlocking mechanism is provided, after locking (or unlocking) one of the substrate holders 160 placed on one of the substrate attachment/detachment stages 162, the other of the substrate attachment/detachment stages 162 is slid horizontally in order to lock (or unlock) another substrate holder 160.

The substrate holder 160 is provided with a sensor for checking that the substrate W is electrically connected to a contact points when the substrate W is loaded into the substrate holder 160. Signals from the sensor are input to a controller unit (not shown).

The stocker 164, the pretreatment device 126, the activation treatment device 166, the water-cleaning devices 168a, 168b, and the plating apparatus 170 are designed so as to engage with outwardly projecting portions 160a provided at both ends of each substrate holder 160 to thus support the substrate holders 160 in such a state that the substrate holders 160 are suspended in a vertical direction. The pretreatment device 129 has two pretreatment tanks 127 for holding therein a pretreatment liquid, such as pure water (deaerated DIW) having, e.g., a dissolved oxygen concentration of not more than 2 mg/L or the like. As shown in FIG. 3, the arm 180 of the second transfer robot 174b holding the substrate holders 160, which are loaded with the substrates W in a vertical state, is lowered so as to engage with upper ends of the pretreatment tanks 127 to support the substrate holders 160 in a suspended manner. Thus, the pretreatment device 126 is designed so that the substrate holders 160 are immersed together with the substrates W in the pretreatment liquid in the pretreatment tanks 127 to carry out a pretreatment (pre-wetting treatment). The activation treatment device 166 has two activation treatment tanks 183 for holding a chemical liquid therein. As shown in FIG. 3, the arm 180 of the second transfer robot 174b holding the substrate holders 160, which are loaded with the substrates W, in a vertical state, is lowered so as to engage with upper ends of the activation treatment tanks 183 to support the substrate holders 160 in a suspended manner. Thus, the activation treatment device 166 is designed so that the substrate holders 160 are immersed together with the substrates W in the chemical liquid in the activation treatment tanks 183 to carry out an activation treatment.

Similarly, the water-cleaning devices 168a and 168b have two water-cleaning tanks 184a and two water-cleaning tanks 184b which hold pure water therein, respectively, and the plating apparatus 170 has a plurality of plating tanks 186 which hold a plating solution therein. The water-cleaning devices 168a, 168b and the plating apparatus 170 are designed so that the substrate holders 160 are immersed together with the substrates W in the pure water in the water-cleaning tanks 184a, 184b or the plating solution in the plating tanks 186 to carry out water-cleaning or plating in the same manner as described above. The arm 180 of the second transfer robot 174b holding the substrate holders 160, which are loaded with substrates W in a vertical state, is lowered, and air or inert gas is injected toward the substrates W mounted on the substrate holders 160 to blow away a liquid attached to the substrate holders 160 and the substrates W and to dewater the substrates W. Thus, the blowing device 172 is designed so as to carry out blowing treatment.

Figure 7:
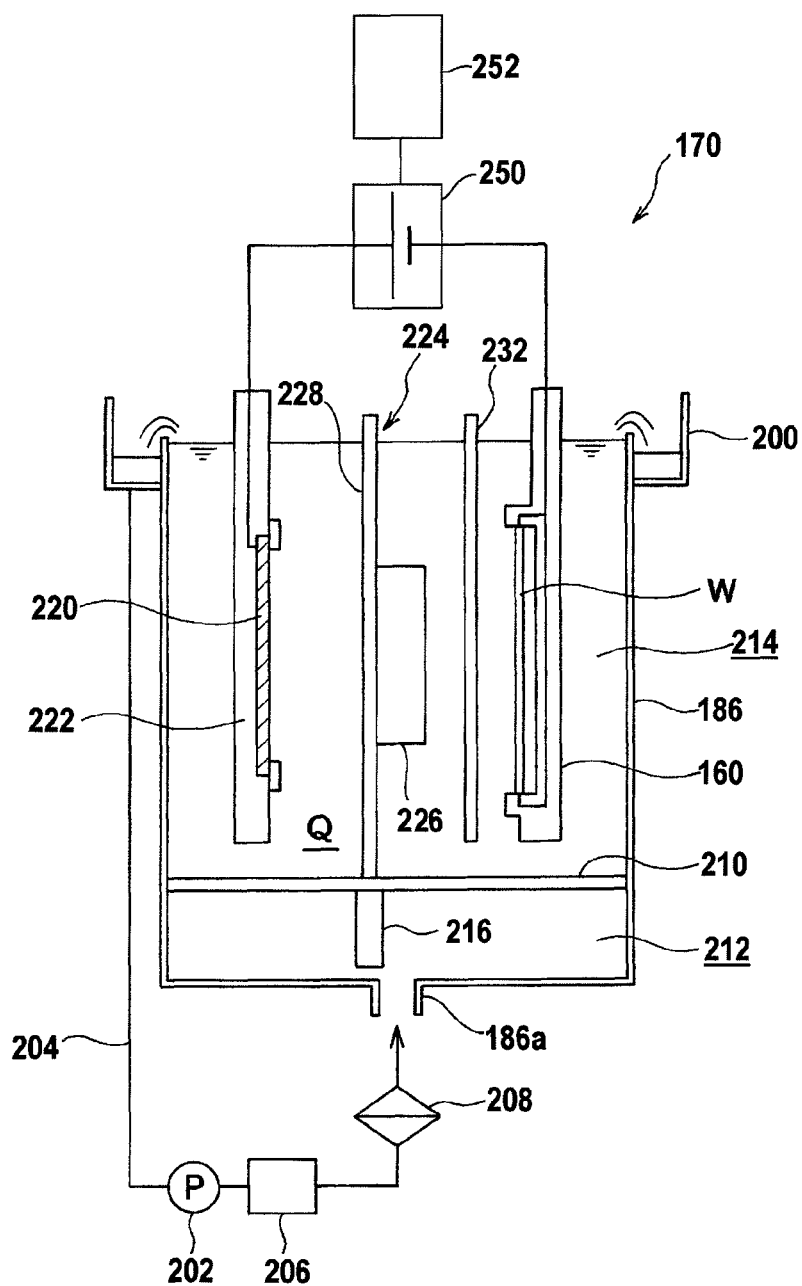
FIG. 7 is a schematic cross-sectional view of a plating apparatus provided in the plating facility shown in FIG. 2.

As shown in FIG. 7, each plating tank 186 provided in the plating apparatus 170 is designed so as to hold a predetermined amount of plating solution Q therein. The substrates W, which are held in a state such that the front faces (surfaces to be plated) are exposed while peripheral portions of the substrates are watertightly sealed by the substrate holder 160, are immersed in the plating solution Q in a vertical direction. In this embodiment, a plating solution which, in addition to copper ions, a supporting electrolyte and halogen ions, contains various additives such as SPS (bis(3-sulfopropyl)disulfide) as a plating accelerator, PEG (polyethylene glycol) as a suppressor, and PEI (polyethylene imine) as a leveler, for example, is used as the plating solution Q. Sulfuric acid is preferably used as the supporting electrolyte, and chlorine ions are preferably used as the halogen ions.

An overflow tank 200 for receiving the plating solution Q that has overflowed an edge of the plating tank 186 is provided around an upper end of the plating tank 186. One end of a circulation piping 204, which is provided with a pump 202, is connected to a bottom of the overflow tank 200, and the other end of the circulation piping 204 is connected to a plating solution supply inlet 186a provided at a bottom of the plating tank 186. Thus, the plating solution Q in the overflow tank 200 is returned into the plating tank 186 by the actuation of the pump 202. Located downstream of the pump 202, a constant-temperature unit 206 for controlling the temperature of the plating solution Q and a filter 208 for filtering out foreign matter contained in the plating solution are interposed in the circulation piping 204.

A bottom plate 210, having a large number of plating solution passage holes therein, is installed in the bottom of the plating tank 186. The interior of the plating tank 186 is thus separated by the bottom plate 210 into an upper substrate processing chamber 214 and a lower plating solution distribution chamber 212. Further, a shield plate 216, extending vertically downward, is mounted to the lower surface of the bottom plate 210.

According to this plating apparatus 170, the plating solution Q is introduced into the plating solution distribution chamber 212 of the plating tank 186 by the actuation of the pump 202, flows into the substrate processing chamber 214 passing through the plating solution passage holes provided in the bottom plate 210, flows vertically approximately parallel to the surface of the substrate W held by the substrate holder 160, and then flows into the overflow tank 200.

An anode 220 having a circular shape corresponding to the shape of the substrate W is held by an anode holder 222 and provided vertically in the plating tank 186. When the plating solution Q is filled in the plating tank 186, the anode 220 held by the anode holder 222 becomes immersed in the plating solution Q in the plating tank 186 and faces the substrate W held by the substrate holder 160 and disposed in the plating tank 186. In this embodiment, the anode 220 is formed of copper (phosphorus-containing copper) containing 0.03 to 0.05% by weight of phosphorus in order to suppress the generation of slime.

Further, in the plating tank 186, a regulation plate 224, for regulating the distribution of electric potential in the plating tank 186, is disposed between the anode 220 and the substrate W to be disposed at a predetermined position in the plating tank 186. In this embodiment, the regulation plate 224 is comprised of a cylindrical portion 226 and a rectangular flange portion 228, and is made of polyvinyl chloride that is a dielectric material. The cylindrical portion 226 has such an opening size and axial length as to sufficiently restrict broadening of electric field. A lower end of the flange portion 228 of the regulation plate 224 reaches the bottom plate 210.

Between the regulating plate 224 and the substrate W to be disposed at a predetermined position in the plating tank 186 is disposed a vertically-extending stirring paddle 232 as a stirring tool which reciprocates parallel to the surface of the substrate W to stir the plating solution Q between the substrate W and the regulating plate 224. By stirring the plating solution Q with the stirring paddle (stirring tool) 232 during plating, a sufficient amount of copper ions can be supplied uniformly to the surface of the substrate W.

Figure 8:
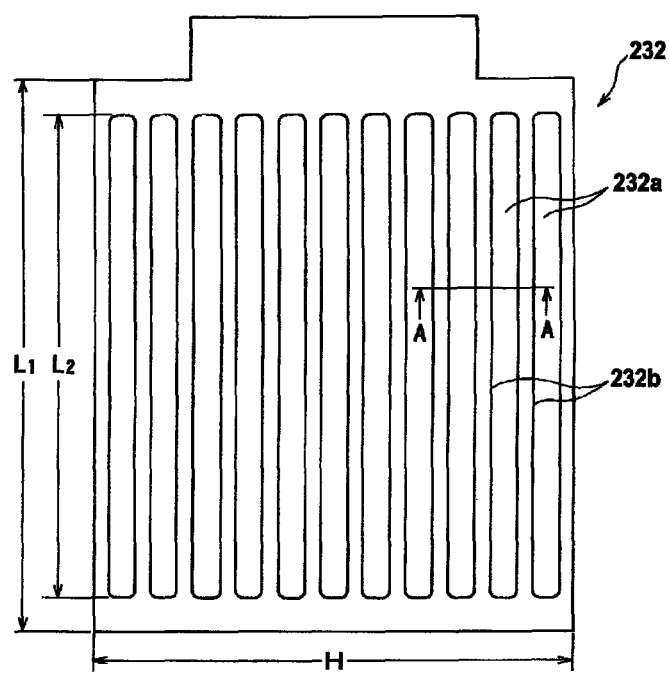
FIG. 8 is a plan view of a stirring paddle (stirring tool) provided in the plating apparatus shown in FIG. 7.
Figure 9:
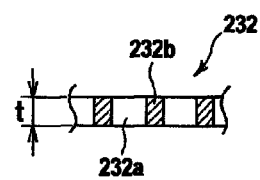
FIG. 9 is a cross-sectional view taken along line A-A of FIG. 8.

As shown in FIGS. 8 and 9, the stirring paddle 232 is comprised of a rectangular plate-like member having a uniform thickness "t" of 3 to 5 mm, and has a plurality of parallel slits 232*a* that define vertically-extending strip-like portions 232*b*. The stirring paddle 232 is formed of, for example, a resin such as PVC, PP and PTFE, and SUS or titanium with a Teflon coating. It is preferred that at least part of the stirring paddle 232, which contacts the plating solution, be electrically isolated. The vertical length $L_1$ of the stirring paddle 232 and the vertical length $L_2$ of the slits 232*a* are sufficiently larger than the vertical size of the substrate W. Further, the stirring paddle 232 is so designed that the sum of its lateral length H and its reciprocation distance (stroke) is sufficiently larger than the lateral size of the substrate W.

It is preferred that the width and the number of the slits 232*a* be determined such that each strip-shaped portion 232*b* is as narrow as possible insofar as it has the necessary rigidity so that the strip-shaped portions 232*b* between the slits 232*a* can efficiently stir the plating solution and, in addition, the plating solution can efficiently pass through the slits 232*a*.

The plating apparatus 170 is provided with a plating power source 250 of which the positive pole is connected via a conducting wire to the anode 220 and the negative pole is connected via a conducting wire to the surface of the substrate W during plating. The plating power source 250 is connected to a control section 252, and the plating apparatus 170 is controlled based on signals from the control section 252.

A description will now be made of a series of processes for filling the plated metal 18 of copper into the vias 12 formed in the surface of the base 10, as shown in FIG. 1B, by performing electroplating of the surface of the substrate W using the plating facility shown in FIG. 2.

First, the substrate W is placed, with its front surface (surface to be plated) facing upwardly, in a substrate cassette, and the substrate cassette is mounted on the loading/unloading port 120. One of the substrates W is taken out of the substrate cassette mounted on the loading/unloading port 120 by the first transfer robot 128 and placed on the aligner 122 to align an orientation flat or a notch of the substrate W with a predetermined direction. On the other hand, two substrate holders 160, which have been stored in a vertical state in the stocker 164, are taken out by the second transfer robot 174*a*, rotated through 90° so that the substrate holders 160 are brought into a horizontal state, and then placed in parallel on the substrate attachment/detachment stages 162.

The substrates W aligned the orientation flat or the notch thereof with a predetermined direction are transferred and loaded into the substrate holders 160 placed on the substrate attachment/detachment stages 162 in a state such that peripheral portions of the substrates are sealed. The two substrate holders 160, which have been loaded with the substrates W, are simultaneously retained, lifted, and then transferred to the stocker 164 by the second transfer robot 174*a*. The substrate holders 160 are rotated through 90° into a vertical state and lowered so that the two substrate holders 160 are held (temporarily stored) in the stocker 164 in a suspended manner. The above operation is carried out repeatedly in a sequential manner, so that substrates are sequentially loaded into the substrate holders 160, which are stored in the stocker 164, and are sequentially held (temporarily stored) in the stocker 164 at predetermined positions in a suspended manner.

On the other hand, the two substrate holders 160, which have been loaded with the substrates and temporarily stored in the stocker 164, are simultaneously retained, lifted, and then transferred to the pretreatment device 126 by the second transfer robot 174*b*. Each substrate is immersed in a pretreatment liquid, such as pure water (DIW), held in the pretreatment tank 127 to thereby carry out a pretreatment (pre-wetting treatment). A dissolved oxygen concentration of pure water used as the pretreatment liquid is preferably controlled not more than 2 mg/L by using a vacuum deaerator or introducing inactive gas.

In plating using a copper sulfate plating solution, aeration of the plating solution is generally carried out to stabilize additives. If above-described pretreatment of a substrate is not carried out, air bubbles will not fully escape from vias when the substrate is immersed in the plating solution because of the high concentration of dissolved oxygen in the plating solution, which may result in a local lack of plating. The problem is serious especially in via-filling plating for vias having a very high aspect ratio, to which the present invention is directed. When a substrate is pretreated with deaerated pure water as described above, air bubbles remaining in high-aspect ratio vias dissolve in the pure water and the vias become entirely wetted with water. Therefore, when the substrate is immersed in the plating solution, the plating solution will easily enter the vias, making it possible to complete via-filling plating without a local lack of plating.

Next, the two substrate holders 160, each loaded with the substrate W, are transferred to the activation treatment device 166 in the same manner as described above, where the substrates W are immersed in a solution of an inorganic acid such as sulfuric acid or hydrochloric acid, or a solution of an organic acid such as citric acid or oxalic acid, held in the activation treatment tanks 183 to etch away an oxide film having a high electrical resistance from the surface of the seed layer, thereby exposing a clean metal surface. As with pure water for use in the above-described pretreatment, the concentration of dissolved oxygen in an acid solution for use in the activation treatment may be controlled. After the activation treatment, the substrate holders 160, each loaded with the substrate W, are transferred to the first water-cleaning device 168*a* in the same manner as described above, where the surfaces of the substrates W are cleaned with pure water held in the first water-cleaning tanks 184*a*.

After the water cleaning, the two substrate holders 160, each loaded with the substrate W, are transferred to above the plating tanks 186 of the plating apparatus 170 in the same manner as described above. The plating tanks 186 have been filled with a predetermined amount of plating solution Q having a predetermined composition, the plating solution being circulated through the circulation system. With reference to a plating solution to be used for filling of vias having a high aspect ratio, the metal ion concentration of the plating solution should be made as high as possible in order to sufficiently supply metal ions into the vias. In the case of a copper sulfate plating solution, it may have, for example, a sulfuric acid concentration of about 50 g/l, a copper sulfate (hydrate) concentration of about 250 g/l and a pH of about 1. The temperature of a plating solution during plating may generally be 20 to 40° C.

The substrate holders 160 are then lowered to immerse the substrates W, held by the substrate holders 160, in the plating solution Q in the plating tanks 186. Each substrate W is disposed in the plating solution Q at a position facing the anode 220 held by the anode holder 222.

Next, the positive pole of the plating power source 250 is connected to the anode 220, and the negative pole of the plating power source 250 is connected to the copper seed layer 16 (see FIG. 1A) of the substrate W. The plating power source 250 is controlled by the control section 252 so that a plating current shown in FIG. 10 flows between the anode 220 and the copper seed layer 16, thereby depositing a plated metal (copper) 18 on the surface of the seed layer 16 and filling the plated metal 18 into the vias 12.

Figure 10:
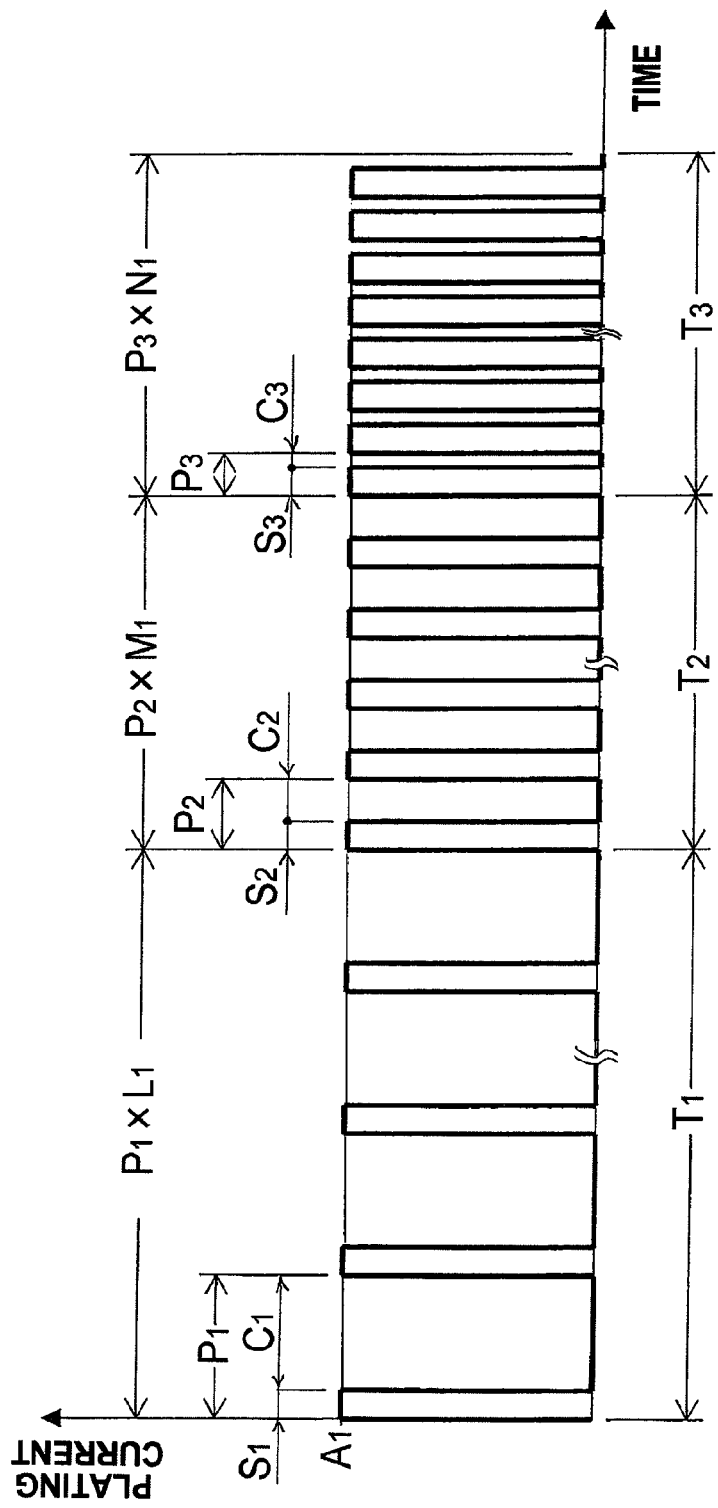
FIG. 10 is a graph illustrating a manner of passing a plating current between an anode and a substrate according to an embodiment of the present invention.

FIG. 10 is a graph illustrating a manner of passing a plating current between the anode 220 and the copper seed layer 16 of the substrate W according to an embodiment of the present invention. In the embodiment illustrated in FIG. 10, early-stage plating over a time $T_1$, middle-stage plating over a time $T_2$ and later-stage plating over a time $T_3$, in which a plating current is passed between the anode 220 and the copper seed layer 16 of the substrate W in different patterns, are carried out successively.

In particular, in the early-stage plating over the time $T_1$, a current supply pitch (interval) $P_1$, which is the sum of a current supply time $S_1$ during which a plating current at a current value $A_1$ is continuously supplied and a current stop time $C_1$ during which the supply of the plating current is stopped, is repeated $L_1$ times ($T_1=P_1 \times L_1$). In the middle-stage plating over the time $T_2$, a current supply pitch (interval) $P_2$, which is the sum of a current supply time $S_2$ during which a plating current at a current value $A_1$ is continuously supplied and a current stop time $C_2$ during which the supply of the plating current is stopped, is repeated $M_1$ times ($T_2=P_2 \times M_1$). In the later-stage plating over the time $T_3$, a current supply pitch (interval) $P_3$, which is the sum of a current supply time $S_3$ during which a plating current at a current value $A_1$ is continuously supplied and a current stop time $C_3$ during which the supply of the plating current is stopped, is repeated $N_1$ times ($T_3=P_3 \times N_1$).

The current supply time $S_1$ in the early-stage plating, the current supply time $S_2$ in the middle-stage plating, and the current supply time $S_3$ in the later-stage plating are set all equal ($S_1=S_2=S_3$). The current stop time $C_1$ in the early-stage plating, the current stop time $C_2$ in the middle-stage plating, and the current stop time $C_3$ in the later-stage plating are set such that the current stop time C decreases stepwise in this order ($C_1>C_2>C_3$). Accordingly, the current supply pitch P decreases stepwise in the following order: the current supply pitch $P_1$ in the early-stage plating, the current supply pitch $P_2$ in the middle-stage plating and the current supply pitch $P_3$ in the later-stage plating ($P_1>P_2>P_3$).

Thus, electroplating is carried out by intermittently supplying a plating current between the anode 220 and the copper seed layer 16 of the substrate W. During a current stop time when the supply of the plating current is stopped, a decrease in the metal ion concentration of the plating solution in the vicinity of the substrate W, especially a shortage of metal ions in the bottoms of vias 12, can be eliminated by utilizing diffusion of ions in the plating solution towards the substrate W caused by a concentration gradient of the ions. Thus, a sufficient amount of metal ions can be supplied into the vias 12. This makes it possible to promote the bottom-up growth of plating utilizing an additive(s) in the plating solution and form a plated metal (plated film) 18 having a uniform thickness.

Further, according to the plating method of this embodiment, a plating current at a constant current value $A_1$ is passed between the anode 220 and the copper seed layer 16 throughout the early-stage plating, the middle-stage plating and the later-stage plating. The consumption of an additive(s) contained in the plating solution is influenced by an anode current density. In this embodiment, an average current density at the copper seed layer (cathode) 16 is controlled at a low level by adjusting the proportion between a current supply time and a current stop time while keeping the current density at the anode 220 in an appropriate range in consideration of the consumption of the additive(s). This makes it possible to perform good via-filling plating while preventing the formation of voids in the plated metal 18 to be embedded in the vias 12.

On the other hand, in the method of increasing the current density in a stepwise fashion as disclosed in Japanese Patent Laid-Open Publication No. 2003-318544, it is necessarily to set the current density at a very low level in an early plating stage. This can lead to deviation of an anode current density from an appropriate range, resulting in a large consumption of an additive in a plating solution.

When phosphorus-containing copper, containing 0.03 to 0.05% by weight of phosphorus, is used for an anode, a surface film can peel off the anode at a very low current density, resulting in the generation of slime. The slime, when attached to a substrate, will cause problems such as abnormal growth of plating. Thus, also from this point, a plating current must be applied at least at a certain level of current value. This requirement, however, can only be met with difficulty by the method of increasing a current in a stepwise fashion.

As the plated metal 18 is gradually filled into the vias 12 with the progress of electroplating, the depth of the unfilled portion of each via 12 gradually decreases, that is, the aspect ratio of the unfilled portion gradually decreases. The lower the aspect ratio is, the easier is via-filling plating with stable bottom-up growth of plating. Accordingly, filling of the plated metal 18 into the vias 12 can be performed efficiently by decreasing a current stop time, which is to supply metal ions into the vias 12, with the progress of plating and in response to change in the degree of filling of the plated metal into the vias 12, i.e., change in the aspect ratio of the unfilled portion of each via.

During the electroplating, the stirring paddle 232 is reciprocated parallel to the substrate W, as necessary, to stir the plating solution Q between the regulation plate 224 and the substrate W. The stirring paddle 232 is to reciprocate parallel to the substrate surface, thereby creating a flow of the plating solution parallel to the substrate surface. The flow velocity of the plating solution can be made significantly higher over the substrate surface than in the vias (see "Copper Electroplating Process for Via Filling in 3D Packaging", Advanced Metallization Conference 2009, 19th Asian Session, pp. 96-97, 2009, and "Electroplating Copper Filling for 3D Packaging", 59th Electronic Components & Technology Conference, pp. 648-653, 2009). Therefore, the etching action of the plating solution during a current stop time is exerted only on the substrate surface, whereby the unnecessary surface plated film can be dissolved in the plating solution. In addition, the metal concentration of the plating solution can be increased at the interface between the substrate and the plating solution. This can shorten a current stop time.

In order to obtain a sufficient stirring effect, it is preferred to reciprocate the stirring paddle 232 at an average movement speed of 70 to 100 cm/sec. In a specific example, the stirring paddle 232 is reciprocated at a speed of 250 rpm to obtain an average movement speed of 83 cm/sec. The stirring paddle 232 is designed to reciprocate across the substrate. Therefore, by stirring the plating solution by the stirring paddle 232, it becomes possible to uniformly dissolve over the substrate surface and to make the metal ion concentration of the plating solution uniform at the interface between the substrate and the plating solution.

The regulation plate 224 regulates the potential distribution so as to make a thickness of a plated film uniform over the substrate surface. If the regulation plate 224 is not used, a plated film will be relatively thick in the peripheral portion of the substrate, nearer to the electrical contact, and relatively thin in the central portion of the substrate. There is, therefore, a fear that during a current stop time in the early plating stage, the plating deposited on the central portion of the substrate, together with the underlying seed layer, can dissolve in the plating solution by the etching action of the plating solution. The use of a regulation plate to achieve a uniform potential distribution is, therefore, essential in electroplating which involves a repetition of the supply and the stop of a plating current.

Upon completion of the plating, the application of a voltage between the anode 220 and the copper seed layer 16 of the substrate W is stopped. Thereafter, the two substrate holders 160, each loaded with the substrate W, are held again by the second transfer robot 174b and withdrawn from the plating tanks 186.

The two substrate holders 160 are then transferred to the second water-cleaning device 168b, where the surfaces of the substrates are cleaned by immersing the substrates in pure water held in the water-cleaning tanks 184b. Thereafter, the substrate holders 160, each loaded with the substrate, are transferred to the blowing device 172 in the same manner as described above, where the plating solution and water droplets are removed from the substrate holders 160 by blowing air or an inert gas onto the substrate holders 160. Thereafter, the substrate holders 160, each loaded with the substrate, are returned to the stocker 164 and are each suspended and held at a predetermined position in the stocker 164 in the same manner as described above.

The second transfer robot 174b sequentially repeats the above operations to sequentially return substrate holders 160, each loaded with a substrate after plating, to predetermined positions in the stocker 164 and suspend the substrate holders 160 in the stocker 164. On the other hand, two substrate holders 160 loaded with substrates after plating, which have been returned to the stocker 164, are simultaneously gripped by the second transfer robot 174a, and are placed on the substrate attachment/detachment stages 162 in the same manner as described above.

The first transfer robot 128, disposed in the clean space 114, takes a substrate out of a substrate holder 160 placed on one of the substrate attachment/detachment stages 162 and transfers the substrate to one of the cleaning/drying devices 124. In the cleaning/drying device 124, the substrate, which is held in a horizontal position with the front surface facing upwardly, is cleaned, e.g., with pure water and then spin-dried by rotating it at a high speed. Thereafter, the substrate is returned by the first transfer robot 128 to the substrate cassette mounted on the loading/unloading port 120, thereby completing the sequence of plating operations.

Figure 11:
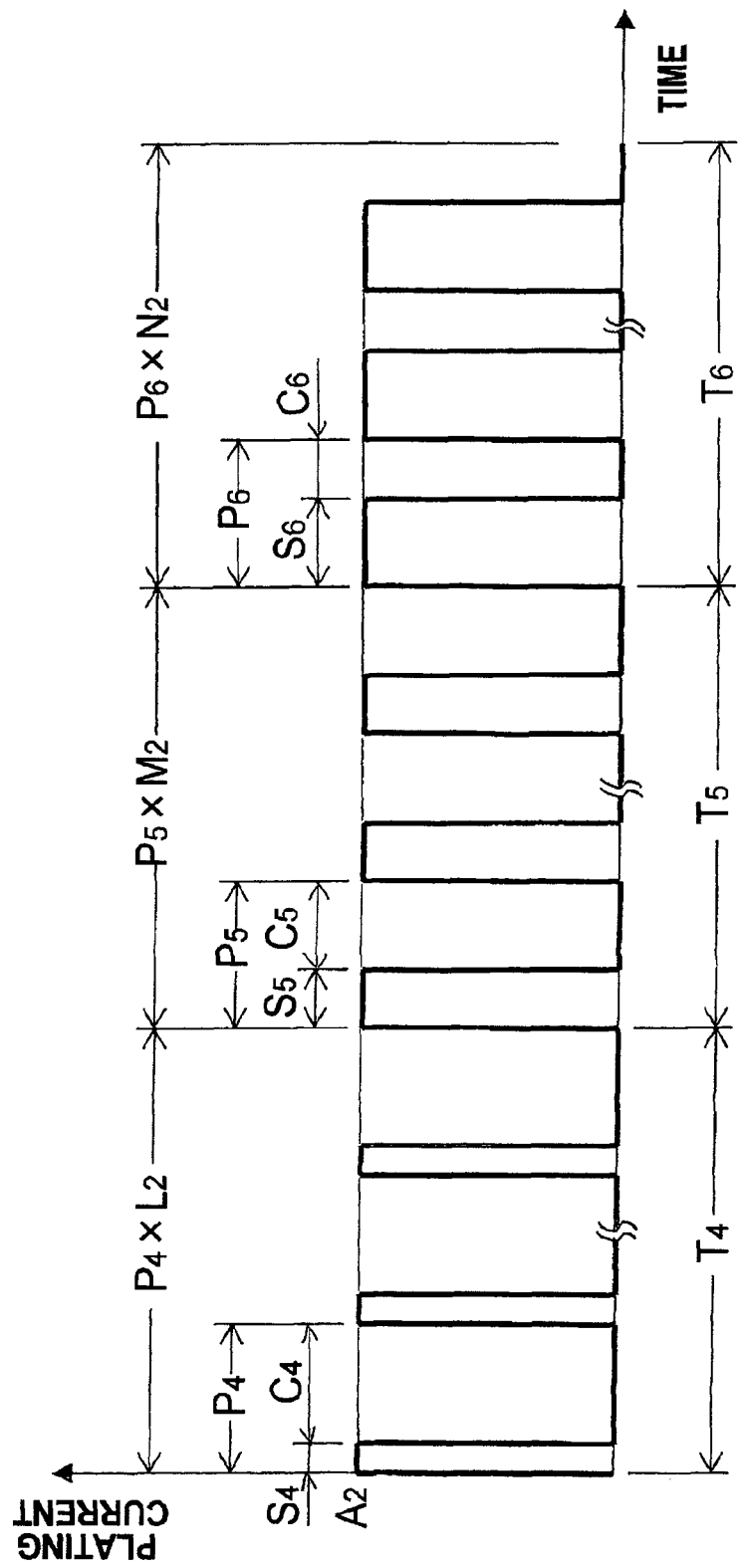
FIG. 11 is a graph illustrating a manner of passing a plating current between an anode and a substrate according to another embodiment of the present invention.

FIG. 11 is a graph illustrating a manner of passing a plating current between the anode 220 and the copper seed layer 16 of a substrate W according to another embodiment of the present invention. In the embodiment illustrated in FIG. 11, early-stage plating over a time $T_4$, middle-stage plating over a time $T_5$ and later-stage plating over a time $T_6$, in which a plating current is passed between the anode 220 and the copper seed layer 16 of the substrate W in different patterns, are carried out successively.

In particular, in the early-stage plating over the time $T_4$, a current supply pitch (interval) $P_4$, which is the sum of a current supply time $S_4$ during which a plating current at a current value $A_2$ is continuously supplied and a current stop time $C_4$ during which the supply of the plating current is stopped, is repeated $L_2$ times ($T_4=P_4 \times L_2$). In the middle-stage plating over the time $T_5$, a current supply pitch (interval) $P_5$, which is the sum of a current supply time $S_5$ during which a plating current at a current value $A_2$ is continuously supplied and a current stop time $C_5$ during which the supply of the plating current is stopped, is repeated $M_2$ times ($T_5=P_5 \times M_2$). In the later-stage plating over the time $T_6$, a current supply pitch (interval) $P_6$, which is the sum of a current supply time $S_6$ during which a plating current at a current value $A_2$ is continuously supplied and a current stop time $C_6$ during which the supply of the plating current is stopped, is repeated $N_2$ times ($T_6=P_6 \times N_2$).

The current supply pitch $P_4$ in the early-stage plating, the current supply pitch $P_5$ in the middle-stage plating, and the current supply pitch $P_6$ in the later-stage plating are set all equal ($P_4=P_5=P_6$). The current supply time $S_4$ in the early-stage plating, the current supply time $S_5$ in the middle-stage plating, and the current supply time $S_6$ in the later-stage plating are set such that the current supply time S increases stepwise in this order ($S_4<S_5<S_6$). Accordingly, the current stop time C decreases stepwise in the following order: the current stop time $C_4$ in the early-stage plating, the current stop time $C_5$ in the middle-stage plating and the current stop time $C_6$ in the later-stage plating ($C_4>C_5>C_6$).

Thus, according to this embodiment, electroplating of a substrate is carried out in such a manner that a current supply time increases stepwise and a current stop time decreases stepwise with the progress of plating. This manner of electroplating can also securely and efficiently fill a plated metal, such as copper, into deep high-aspect ratio vias in a bottom-up manner without producing defects, such as voids, in the plated metal to be embedded.

In the above-described embodiments, the three plating steps, i.e., the early-stage plating, the middle-stage plating and the later-stage plating, having different patterns of the supply of a plating current, are carried out successively. It is, however, possible to successively carry out two plating steps having different patterns of the supply of a plating current, or to successively carry out four or more plating steps having different patterns of the supply of a plating current.

It has been confirmed experimentally that a plated metal can be completely filled into vias having a diameter of 5 µm and a depth of 50 µm in 40 minutes by carrying out a first plating step at a current density of 1 ASD for 20 minutes with a current supply time of 20 msec. and a current stop time of 48 msec., and subsequently carrying out a second plating step at a current density of 1 ASD for 20 minutes with a current supply time of 40 msec. and a current stop time of 28 msec.

In the embodiment illustrated in FIG. 10, the current stop time decreases stepwise, while the current supply time is constant. In the embodiment illustrated in FIG. 11, the current supply time increases stepwise, while the current supply pitch is constant. For example, instead of the stepwise decrease in the embodiment illustrated in FIG. 10, it is possible to decrease the current stop time gradually. Further, instead of the stepwise increase in the embodiment illustrated in FIG. 11, it is possible to increase the current supply time gradually.

Via density of a substrate, i.e., the proportion of the total via area in the plating area of a substrate is at most 10% and usually not more than 5%. The higher via density of a substrate is, the more is the amount of metal ions to be supplied into vias, and therefore the higher is the effect achieved by the present invention.

In a via having a high aspect ratio, the surface seed layer of the side wall is likely to be incomplete or defective, which is disadvantageous for plating and can cause defective plating. The probability of the occurrence of defective plating is high for a substrate having high-aspect ratio vias at a high density. When plating is carried out on such a substrate to fill a plated metal into vias, having defective seed layer portions, by using a plating method which uses a very low current in the initial plating step and increases the current in a stepwise fashion such that a plated film can grows including defective seed layer portions, various problems may occur as described previously. In contrast, such problems can be avoided by the plating method of the present invention which uses a constant current density during plating in order for an additive(s) in a plating solution to exert the intended effect. The expression "constant current density" herein includes a variation within the range of about ±10%.

While the present invention has been described with reference to preferred embodiments, it is understood that the present invention is not limited to the embodiments described above, but is capable of various changes and modifications within the scope of the inventive concept as expressed herein. For example, in the above-described embodiments, a plating current at a constant current value is passed between a substrate and an anode in such a manner that the supply and the stop of the plating current are repeated, and that the proportion of a current supply time during which the plating current is supplied increases stepwise with the progress of plating, though, it is possible to change the plating current during plating in such a range as not to cause the above-described problems, such as the consumption of an additive and the generation of slime from an anode.

What is claimed is:

1. An electroplating method comprising:
   immersing a substrate, having vias formed in a surface, and an anode in a plating solution in a plating tank, the anode being disposed opposite the surface of the substrate, and the plating solution containing an additive therein; and
   intermittently passing a plating current at a constant current value between the substrate and the anode in such a manner that only a supply of the plating current and a stop of the plating current are repeated, the stop being such that no current is passed between the substrate and the anode, and such that the proportion of a current supply time during which the plating current is supplied at the constant current value increases with the progress of plating, thereby filling a plated metal into the vias;
   wherein the constant current value of the plating current is maintained at a current value such that a current density at the anode is in a range for suppressing a consumption of the additive.

2. The electroplating method according to claim 1, wherein a current stop time during which the supply of the plating current is intermittently stopped decreases with the progress of plating.

3. The electroplating method according to claim 2, wherein a current supply pitch, at which the supply and the stop of the plating current are intermittently repeated is constant while the plating current is passed between said substrate and said anode.

4. The electroplating method according to claim 1, wherein the current supply time is constant while the plating current is passed between said substrate and said anode.

5. The electroplating method according to claim 1, wherein the current supply time during which the plating current is continuously passed increases with the progress of plating while the plating current is passed between said substrate and said anode.

6. The electroplating method according to claim 5, wherein a current stop time during which the supply of the plating current is intermittently stopped is constant with the progress of plating.

7. The electroplating method according to claim 5, wherein a current supply pitch, at which the supply and the stop of the plating current are intermittently repeated is constant while the plating current is passed between said substrate and said anode.

8. The electroplating method according to claim 1, wherein a current supply pitch, at which the supply and the stop of the plating current are intermittently repeated is constant while the plating current is passed between said substrate and said anode.

* * * * *